United States Patent [19]

Koide

[11] 4,435,654
[45] Mar. 6, 1984

[54] OUTPUT LEVEL ADJUSTMENT MEANS FOR LOW FANOUT ECL LACKING EMITTER FOLLOWER OUTPUT

[75] Inventor: Kazuo Koide, Fuchu, Japan

[73] Assignee: Hitachi, Ltd., Tokyo, Japan

[21] Appl. No.: 259,470

[22] Filed: May 1, 1981

[30] Foreign Application Priority Data

May 2, 1980 [JP] Japan ................................ 55-57814

[51] Int. Cl.³ .................. H03K 19/086; H03K 19/092
[52] U.S. Cl. ..................................... 307/455; 307/443
[58] Field of Search ............... 307/446, 455, 467, 475, 307/264, 443

[56] References Cited

U.S. PATENT DOCUMENTS

| 3,529,294 | 9/1970 | Zuk ..................................... 365/155 |
| 3,573,488 | 4/1971 | Beelitz ............................. 307/455 X |
| 3,648,064 | 3/1972 | Mukai et al. ...................... 307/446 X |
| 3,942,033 | 3/1976 | Swiatowiec et al. ................ 307/455 |
| 4,255,672 | 3/1981 | Ohno et al. ......................... 307/467 |

FOREIGN PATENT DOCUMENTS 52-2161   1/1977   Japan ................................ 307/455

OTHER PUBLICATIONS

Camenzind, "Circuit Design for Integrated Electronics", Addison–Wesley Pub. Co., pp. 157–159, 1968.

Primary Examiner—Larry N. Anagnos
Assistant Examiner—David R. Hudspeth
Attorney, Agent, or Firm—Antonelli, Terry & Wands

[57] ABSTRACT

A complex logic circuit which fulfills the requirements of high-speed operation, low power consumption and simplicity in circuit setup, includes a first ECL (emitter coupled logic) circuit and a second ECL circuit. The first ECL circuit which drives relatively light loads does not have an emitter follower output circuit in the output thereof. The second ECL circuit which drives relatively heavy loads has an emitter follower output circuit in the output thereof. A level shift means is connected between the load resistor of the first ECL circuit and a point of operation potential, and the voltage drop across the level shift means is set to be substantially equal to the voltage across the base and emitter of the emitter follower output transistor of the second ECL circuit. Thus, the signal levels of the first and second ECL circuits can be made to coincide.

7 Claims, 10 Drawing Figures

OUTPUT LEVEL ADJUSTMENT MEANS FOR LOW FANOUT ECL LACKING EMITTER FOLLOWER OUTPUT

BACKGROUND OF THE INVENTION

The present invention relates to a complex logic circuit composed of ECL (emitter coupled logic) circuitry.

ECL (or often CML: current mode logic) circuits can be constructed either as a differential transistor circuit without an emitter follower output circuit, as shown in FIG. 1, or as a differential transistor circuit with an emitter follower output circuit as shown in FIG. 2. The ECL circuit without an emitter follower output circuit and the ECL circuit having an emitter follower output circuit have both been reported in a journal "CIRCUIT DESIGN FOR INTEGRATED ELECTRONICS" by H. R. Camenzind, published by Addison-Wesley Co., 1968, pp. 157–159.

The provision of the emitter follower output circuit presents such advantages as increased driving ability while enabling a wired-or circuit to be constructed. On the other hand, it presents such defects as increased delay time (usually from 0.2 to 0.3 nanoseconds) due to the emitter follower circuit, increased power consumption, and an increased number of elements for constituting the circuit.

When the emitter follower output circuit is eliminated, on the other hand, the circuit operates at high speeds while consuming less electric power. For relatively heavy loads having a large number of fan outs, however, the circuit cannot operate at high speeds since its driving ability is small, and it also becomes difficult to constitute wired-or circuits.

In designing the control logic circuits (random logic circuits) consisting of gate circuits, logic arithmetic circuits, shift registers, and the like, the inventor of the present application has contrived to exploit the features of the above-mentioned two types of ECL circuits or to use the ECL circuit of either type depending upon heavy loads and light loads. Namely, the ECL circuit without the emitter follower output circuit shown in FIG. 1 is used for the circuits for driving relatively light loads so that the operation can be carried out at high speeds under light load conditions, and the ECL circuit having the emitter follower output circuit shown in FIG. 2 is used for the circuits for driving relatively heavy loads or for the circuits which perform the wired-or function.

In the ECL circuit shown in FIG. 1, however, a reference voltage $V_B$ is set to be, for example, $-0.3$ V, the high level of the input voltage IN is set to be 0 V, and the low level of the input voltage IN is set to be about $-0.6$ V. In the ECL circuit shown in FIG. 2, on the other hand, the reference voltage $V_B$ is set to be $-1.1$ V, the high level of the input voltage IN is set to be $-0.8$ V, and the low level of the input voltage IN is set to be about 31 1.4 V. When the signals are to be delivered and received between the ECL circuit of FIG. 1 and the ECL circuit of FIG. 2, however, it becomes necessary to provide a level converting circuit. The level converting circuit, however, makes it difficult to maintain high-speed operation, to simplify the circuit setup or to reduce the consumption of electric power. Furthermore, in designing the logic circuits, the difference in the signal levels must be taken into consideration; i.e., the level converting circuit makes the design complicated. Moreover, it is necessary to provide two circuits for generating the reference voltage $V_B$.

From the foregoing facts, it was clarified that a complex logic circuit made up of the combination of the ECL circuit of FIG. 1 and the ECL circuit of FIG. 2, is not so superior to the case when a complex logic circuit is constructed by using the ECL circuit of FIG. 1 alone or by using the ECL circuit of FIG. 2 alone in a customary manner.

SUMMARY OF THE INVENTION

The object of the present invention is to provide a complex logic circuit which operates at high speeds, which consumes less electric power, and which enables the circuit setup to be simplified.

According to the complex logic circuit of the present invention, the ECL circuit without an emitter follower output circuit is used as a logic circuit for driving relatively light loads, and the ECL circuit having an emitter follower output circuit is used as a logic circuit for driving relatively heavy loads or as a logic circuit which performs the wired-or function in the output thereof. In the ECL circuit without the emitter follower output circuit, a level shift means is connected between a load resistor thereof and a predetermined voltage terminal, in such a manner that the signal levels are brought into coincidence between the ECL circuit without the emitter follower output circuit and the ECL circuit having the emitter follower output circuit.

DESCRIPTION OF THE PREFERRED EMBODIMENTS

The invention will be explained below in detail with reference to the embodiments.

Figure 1:
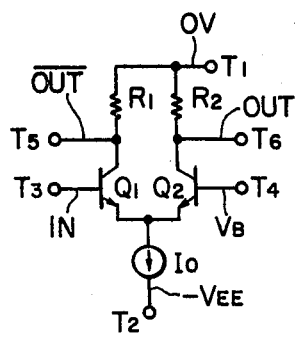
FIGS. 1 and 2 are diagrams of ECL circuits according to the prior art.
Figure 2:
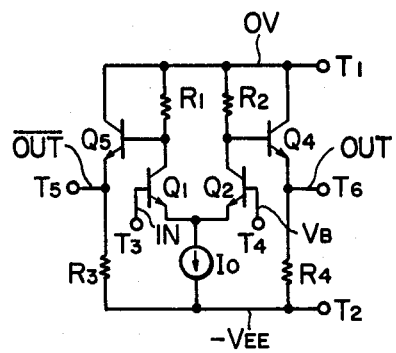
Figure 3:
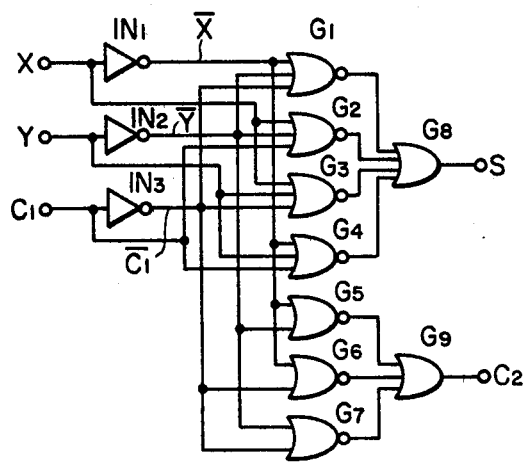
FIG. 3 is a diagram of a full adder circuit which constitutes a portion of a complex logic circuit according to an embodiment of the present invention.

FIG. 3 is a circuit diagram when the present invention is applied to a full adder circuit which constitutes a portion of the complex logic circuit.

The full adder circuit has been widely used for adding binary digits, and consists of an inverter circuit $IN_1$ of which the input terminal is served with an input signal X that is to be added, an inverter circuit $IN_2$ of which the input terminal is served with an input signal Y that is to be added, and an inverter circuit $IN_3$ of which the input terminal is served with a carry input signal $C_1$, and forms the inverted signals $\overline{X}$, $\overline{Y}$ and $\overline{C_1}$. The full adder circuit consists of NOR gate circuits $G_1$ to $G_7$ which are served with input signals X, Y and $C_1$ and with the inverted signals thereof $\overline{X}$, $\overline{Y}$ and $\overline{C_1}$, an OR gate circuit $G_8$ which is served with the output signals of NOR gate circuits $G_1$ to $G_4$, and an OR gate circuit $G_9$ which is served with the output signals of NOR gate circuits $G_5$ to $G_7$.

The output signal S of the OR gate circuit $G_8$ is given by the following logic equation, $$S = \overline{\overline{X} + \overline{Y} + \overline{C_1}} + \overline{X + \overline{Y} + C_1} + \overline{X + Y + \overline{C_1}} + \overline{\overline{X} + Y + C_1} \quad (1)$$

Further, a carry output signal $C_2$ of the OR gate circuit $G_9$ is given by the following logic equation, $$C = \overline{\overline{X} + \overline{Y}} + \overline{\overline{X} + \overline{C_1}} + \overline{\overline{Y} + \overline{C_1}} \quad (2)$$

The full adder circuit can be constituted by the ECL circuits. Namely, according to this embodiment, the ECL circuits having the emitter follower output circuit are used as inverter circuits $IN_1$ to $IN_3$ with many fan outs, and ECL circuits which have level shift means between a collector load resistor and a predetermined voltage terminal, and which are composed of a differential transistor circuit only having a signal level which is in agreement with the signal level of the ECL circuits having the emitter follower output circuit, are used as NOR gate circuits $G_1$ to $G_7$ having one fan out.

This is illustrated below in further detail with reference to a preferred embodiment shown in FIG. 5.

For instance, the above-mentioned inverter circuit $IN_1$ consists of a differential transistor circuit which is composed of a transistor $Q_{12}$ of which the base is connected to a circuit terminal $T_4$, a transistor $Q_{11}$ of which the base is connected to a circuit terminal $T_3$, a constant-current supply $I_0$ connected between a circuit terminal $T_2$ and emitters of the transistors $Q_{11}$, $Q_{12}$ that are commonly connected together, and load resistors $R_{11}$, $R_{12}$ connected between the collectors of the transistors $Q_{11}$, $Q_{12}$ and a circuit terminal $T_1$, and an emitter follower output circuit which consists of a transistor $Q_{13}$ of which the base is connected to the collector for the transistor $Q_{11}$ and of which the collector is connected to the circuit terminal $T_1$, and a resistor $R_{13}$ connected between the emitter of the transistor $Q_{13}$ and the circuit terminal $T_2$.

A voltage of 0 V is applied to the circuit terminal $T_1$, a power-supply voltage $-V_{EE}$ ($-5.2$ V) of negative polarity is applied to the circuit terminal $T_2$, a reference voltage $V_B$ of, for example, $-1.3$ V is applied to the circuit terminal $T_4$, and an input signal X is applied to the circuit terminal $T_3$.

On the other hand, the above-mentioned NOR gate circuit $G_1$ consists of a transistor $Q_{17}$ of which the base is connected to the circuit terminal $T_4$, a transistor $Q_{14}$ of which the base is connected to the emitter of the transistor $Q_{13}$ that serves as an output terminal of the inverter circuit $IN_1$, transistors $Q_{15}$, $Q_{16}$ of which the bases are connected to the similar output terminals of other inverter circuits $IN_2$, $IN_3$, a constant-current supply circuit $I_0'$ which is connected between the circuit terminal $T_2$ and the emitters of transistors $Q_{14}$ to $Q_{17}$ that are commonly connected together, a collector load resistor $R_{15}$ of which one end is connected to the collector of the transistor $Q_{17}$, a collector load resistor $R_{14}$ of which one end is connected to the collectors of the transistors $Q_{14}$ to $Q_{16}$ that are commonly connected together, and a transistor (or a diode) $Q_{18}$ which is connected in the manner of a diode between the other ends of the resistors $R_{14}$, $R_{15}$ that are commonly connected together and the circuit terminal $T_1$, and which serves as level shift means. The output signals will be obtained from the collectors of the transistors $Q_{14}$ to $Q_{16}$ that are commonly connected together.

Figure 5:
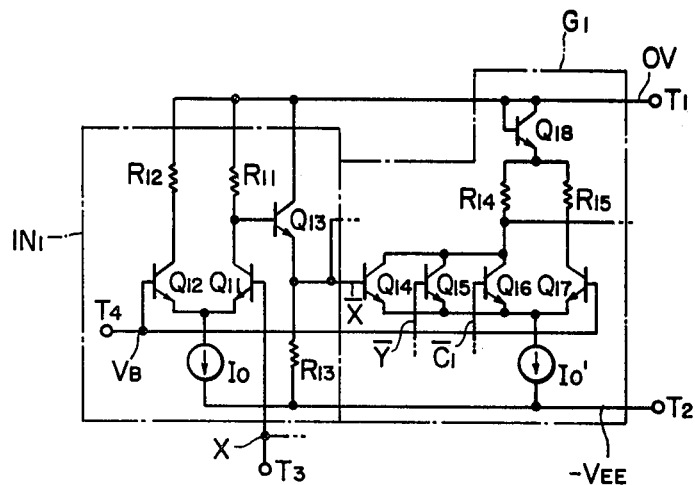
FIG. 5 is a circuit diagram according to a suitable embodiment of the present invention.

Other inverter circuits $IN_2$, $IN_3$ of FIG. 3 are also constructed in the same manner as the inverter circuit $IN_1$ of FIG. 5, and other NOR gate circuits $G_2$ to $G_7$ of FIG. 3 are also constructed in the same manner as the NOR gate circuit $G_1$ of FIG. 5.

When there is only one fan out, the OR gate circuits $G_8$, $G_9$ of FIG. 3 are constructed in the same manner as the gate circuit $G_1$ of FIG. 5. However, since they are the OR gate circuits, the output signal S or $C_2$ is obtained from the collector of a transistor which is served with the reference voltage $V_B$ through its base. On the other hand, when there are many fan outs, the ECL circuit having the emitter follower output circuit is used like the inverter circuit $IN_1$ of FIG. 5. However, since many input signals exist, the corresponding number of input transistors are arrayed in parallel. Further, since the OR gate circuit is employed, the output signal S or $C_2$ is obtained from the emitter follower output circuit to whose base is connected the collector of the transistor that is served with the reference voltage $V_B$ through its base.

Referring to the NOR gate circuit $G_1$ in the circuit of FIG. 5, a voltage (0 V) of the positive side of which the level is shifted is applied to the collector resistors $R_{14}$, $R_{15}$ relying upon a voltage $V_{BE}$ across the base and emitter of the transistor $Q_{18}$. Therefore, the high level can be set to be about $-0.7$ V. The signal level between the two circuits can be set to be nearly equal by employing the collector resistors $R_{14}$, $R_{15}$ and the constant-current circuit $I_0'$ having resistances and current values which are the same as those of the collector resistances $R_{12}$, $R_{13}$ and constant-current circuit $I_0$ of the inverter circuit $IN_1$. As illustrated in FIG. 5, therefore, the reference voltage $V_B$ can be commonly utilized, and the inverter circuit $IN_1$ and the NOR gate circuit which are the two ECL circuits having different circuit types can be directly connected together without the need of providing a level converting circuit.

Figure 4:
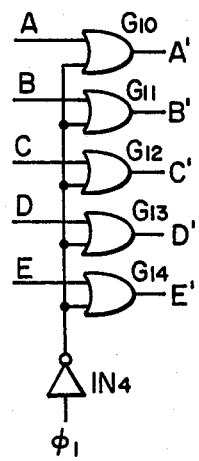
FIG. 4 is a diagram of a signal gate circuit which constitutes a portion of the complex logic circuit according to the embodiment of the present invention.

FIG. 4 is a circuit diagram illustrating an embodiment in which the present invention is applied to a signal gate circuit which constitutes a portion of the complex logic circuit.

This circuit consists of OR gate circuits $G_{10}$ to $G_{14}$ which are served with signals A to E through input terminals of one side thereof, and an inverter circuit $IN_4$ which is served with a gate control signal $\phi_1$ through the input terminal thereof. The output signal of the inverter circuit $IN_4$ is commonly applied to input terminals on the other side of the OR gate circuits $G_{10}$ to $G_{14}$.

When the gate control signal $\phi$ has the level "0", an inverted output signal $\overline{\phi_1}$ thereof has the level "1", whereby the output signals A' to E' of the OR gate circuits $G_{10}$ to $G_{14}$ assume the level "1" irrespective of the input signals A to E, to close the gate. On the other hand, when the gate control signal $\phi$ has the level "1", the inverted output signal $\overline{\phi_1}$ thereof assumes the level "0", and the output signals A' to E' of the OR gate circuits $G_{10}$ to $G_{14}$ assume the levels which correspond to the input signals A to E.

When the individual OR gate circuits $G_{10}$ to $G_{14}$ have only one fan out, the signal gate circuit employs, as OR gate circuits $G_{10}$ to $G_{14}$, the ECL circuits which have level shift means between the collector load resistor and a predetermined voltage terminal as illustrated with reference to the gate circuit $G_1$ of FIG. 5, but which do not have the emitter follower output circuit. On the other hand, as the inverter circuit $IN_4$ having a large number of fan outs, the ECL circuit having the emitter follower output circuit is used as illustrated with reference to the inverter circuit $IN_1$ of FIG. 5.

Figure 6:
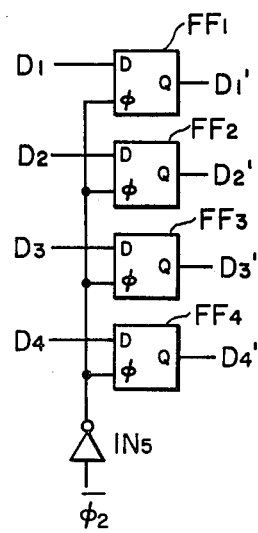
FIG. 6 is a diagram of a latch circuit which constitutes a portion of the complex logic circuit according to the embodiment of the present invention.

FIG. 6 is a circuit diagram of an embodiment in which the present invention is applied to a latch circuit which constitutes a portion of the complex logic circuit.

According to this circuit, a timing signal $\overline{\phi_2}$ is applied, via an inverter circuit $IN_5$, to a clock input terminal that is commonly connected to the flip-flop circuits $FF_1$ to $FF_4$, and signals $D_1$ to $D_4$ that are fed in synchronism with the signal $\phi_2$ that is inverted through the inverter circuit $IN_5$ are applied to the flip-flop circuits $FF_1$ to $FF_4$.

Even in the circuit of this embodiment, the inverter circuit $IN_5$ employs the ECL circuit having the emitter follower output circuit depending upon the number of fan outs, and the circuits constituting the flip-flop circuits $FF_1$ to $FF_4$ with a single fan out, are constructed by the ECL circuits without the emitter follower output circuit but having the level shift means as mentioned above. The circuits having an increased number of fan outs are constructed by the ECL circuits having the emitter follower output circuit.

Figure 7:
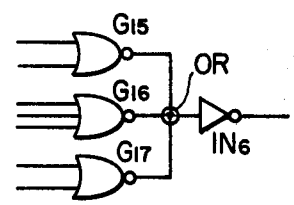
FIG. 7 is a circuit diagram of a wired-or setup which constitutes a portion of the complex logic circuit according to the embodiment of the present invention.

The foregoing description has dealt with the case where the two types of ECL circuits are selectively used depending upon the number of fan outs. Referring to FIG. 7, furthermore, when the wired-or is to be constructed by directly connecting the outputs of NOR gate circuits $G_{15}$ to $G_{17}$, the ECL circuit having the emitter follower output circuit is employed irrespective of the number of fan outs. In this case, the emitters of the output transistors of the emitter follower output circuits consitituting NOR gate circuits, are commonly connected to the common load resistors.

Figure 8:
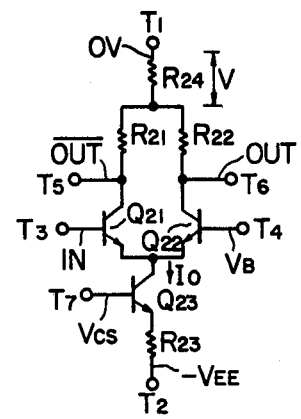
FIG. 8 is a circuit diagram according to another suitable embodiment of the present invention.

FIG. 8 is a circuit diagram illustrating another embodiment of the present invention. The ECL circuit shown in FIG. 8 does not have the emitter follower output circuit but has level shift means composed of a resistor $R_{24}$ instead of level shift means composed of a transistor (or a diode) $Q_{18}$ that is shown in FIG. 5.

Namely, the circuit according to this embodiment consists of a transistor $Q_{22}$ of which the base is connected to a circuit terminal $T_4$, a transistor $Q_{21}$ of which the base is connected to the circuit terminal $T_3$, a transistor $Q_{23}$ of which the collector is connected to the emitters of the transistors $Q_{21}$, $Q_{22}$ that are commonly connected together, and of which the base is connected to the circuit terminal $T_7$, a resistor $R_{23}$ connected between the emitter of the transistor $Q_{23}$ and the circuit terminal $T_2$, collector load resistors $R_{21}$, $R_{22}$ connected to the collectors of the transistors $Q_{21}$, $Q_{22}$, and a level shift resistor $R_{24}$ connected between the circuit terminal $T_2$ and the other ends of the collector load resistors $R_{21}$, $R_{22}$ that are commonly connected together.

A voltage (0 V) of the positive side is applied to the circuit terminal $T_1$, and a voltage $-V_{EE}$ of, for example, $-5.2$ V of the negative side is applied to the circuit terminal $T_1$. A constant voltage $V_{CS}$ is applied to the circuit terminal $T_7$, and a constant-current circuit is formed by the transistor $Q_{23}$ and the emitter resistor $R_{23}$. Further, a reference voltage $V_B$ is applied to the circuit terminal $T_4$, a logic input signal IN is applied to the circuit terminal $T_3$, and an inverted output signal $\overline{OUT}$ is taken out from the circuit terminal $T_5$ that is connected to the collector of the transistor $Q_{21}$, and a non-inverted output signal OUT is obtained from the circuit terminal $T_6$ that is connected to the collector of the transistor $Q_{22}$.

A constant current $I_0$ which is produced by the constant-current circuit is given by the following relation (3), $$I_0 = (V_{CS} - V_{BEQ23})/R_{23} \quad (3)$$

Therefore, the voltage drop V through the level shift resistor $r_{24}$ is found from the following relation (4), $$V = I_0 R_{24} = (V_{CS} - V_{BEQ23})(R_{24}/R_{23}) \quad (4)$$

Here, the voltage $V_{CS}$ and the voltage $V_{BEQ23}$ across the base and emitter of the transistor $Q_{23}$ remain constant. Accordingly, the voltage V is determined by the ratio of resistance $R_{24}$ to resistance $R_{23}$. Even when the circuit of this embodiment is constituted by a monolithic semiconductor integrated circuit, the resistance ratio can be precisely set in the monolithic semiconductor integrated circuit. Accordingly, the level shift means can be set up relying upon the resistances. Further, by setting the voltage V to be equal to the voltage $V_{BE}$ across the base and emitter of the transistor, the signal level can be brought into agreement with that of the ECL circuit having the emitter follower output circuit.

Figure 9:
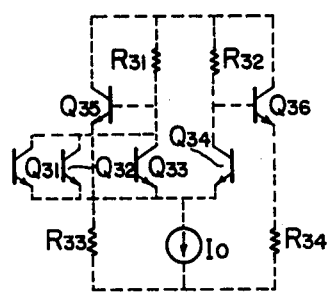
FIG. 9 is a diagram of a fundamental circuit setup for forming the complex logic circuit of the present invention relying upon a monolithic semiconductor integrated circuit of the type of master slice.
Figure 10:
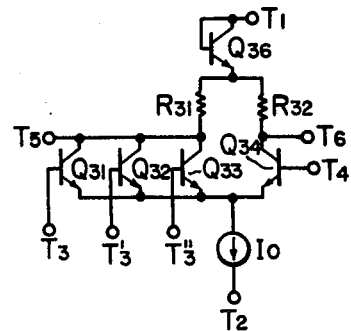
FIG. 10 is a circuit diagram in which the fundamental circuit setup of FIG. 9 is not provided with the emitter follower output circuit.

FIG. 9 is a diagram of a fundamental circuit setup when the complex logic circuit is constructed in the form of a monolithic semiconductor integrated circuit relying upon the master slice system according to a further embodiment of the present invention. Namely, the ECL circuit having the emitter follower circuit is provided with transistors $Q_{31}$ to $Q_{36}$, resistors $R_{31}$ and $R_{34}$, and a constant-current circuit $I_0$. When the ECL circuit having the emitter follower output circuit is to be formed, wirings are formed as indicated by the dotted lines in FIG. 9. When the ECL circuit without the emitter follower output circuit is to be formed, the connection is made as indicated by the solid lines in FIG. 10, and the ECL circuit is made up of the constant-current circuit $I_0$, transistors $Q_{31}$ to $Q_{34}$, and resistors $R_{31}$, $R_{32}$. Further, the transistor $Q_{36}$ which had been formed to constitute the emitter follower output circuit is connected in the manner of a diode between the resistors $R_{31}$, $R_{32}$ and the circuit terminal $T_1$ which supplies the voltage.

When a resistor is to be used as level shift means, the emitter resistor $R_{34}$ which constitutes the emitter follower output circuit may be used.

In this case, it is necessary to set the resistance of the resistor $R_{34}$ beforehand in such a manner that the above-mentioned resistance ratio is obtained depending upon the constant voltage $V_{CS}$ of the constant-current circuit.

According to the circuit of the aforementioned embodiment, the object can be achieved on account of the reasons mentioned below.

In constituting the complex logic circuit, the ECL circuit of relatively light loads is formed by the one without having the emitter follower output circuit, and the signal level is brought by the level shift means into agreement with that of the ECL circuit having the emitter follower output circuit, in such a manner that the signals can be directly delivered and received. Accordingly, the complex logic circuit of the present invention features high-speed operation owing to the ECL circuit without the emitter follower output circuit under the light load conditions. Further, owing to the use of the ECL circuit without the emitter follower output circuit, the number of elements constituting the circuit can be reduced, and the consumption of electric current can be reduced as well. Further, when the complex logic circuit is to be formed in the form of a monolithic semiconductor integrated circuit, the degree of integration can be increased owing to the reduction in the number of elements. In particular, when the master slice system is employed, the ECL circuits of two different types can be selectively obtained based upon the same fundamental circuit setup.

The present invention is in no way limited to the above-mentioned embodiments only; the signal levels and the voltages may be set to slightly different values. Further, in order to reduce the consumption of electric power of the emitter follower output circuit, a terminal may be provided to supply a voltage which is lower than the low level, or to supply a voltage of −2 V, and the load resistors of the emitter follower output circuit may be connected thereto.

Moreover, the ECL circuit having the emitter follower output circuit is better employed not only when there are many fan outs and the wired-or function is to be performed, but also when the output wiring has large capacity although the number of fan outs is only one.

Thus, whether the ECL circuit having the emitter follower output circuit should be employed or not, is determined depending upon whether the load carried by the ECL circuit without the emitter follower output circuit causes the signal delay time to become greater than the delay time in the emitter follower output circuit.

Further, the differential transistor circuits constituting the ECL circuit having the emitter follower output circuit and the ECL circuit without the emitter follower output circuit, may have collector load resistors and the constant-current supplies having different values within such ranges that the signal levels of the two circuits are in agreement with each other.

What is claimed is:

1. A complex logic circuit comprising a plurality of emitter coupled logic circuits commonly connected to a reference potential for comparing with input signals respectively received by said emitter coupled logic circuits, said complex logic circuit comprising:

a first emitter coupled logic circuit having first and second load resistors, a first current source, a first current switch transistor having its base electrode connected to a signal input terminal, its emitter electrode connected to said first current source and its collector electrode connected to a point of operation potential through said first load resistor, a second current switch transistor having its base electrode connected to a reference potential point which is supplied with said reference potential, its emitter electrode connected to said first current source and its collector electrode connected to said point of operation potential through said second load resistor, and an emitter follower output circuit having its input connected to an electrode selected from said collector electrodes of said first and second current switch transistors and its output coupled to an output terminal of said first emitter coupled logic circuit, and a second emitter coupled logic circuit having third and forth load resistors, a second current source, a third current switch transistor having its base electrode connected to a signal input terminal, its emitter electrode connected to said second current source and its collector electrode connected to a node through said third load resistor, a fourth current switch transistor having its base electrode connected to a reference potential point which is supplied with the same reference potential as that supplied to the reference potential point of said second current switch transistor, its emitter electrode connected to said second current source and its collector electrode connected to said node through said fourth load resistor and a level shift element which is connected between said point of operation potential and said node, wherein at least one collector electrode of said third and fourth current switch transistors is connected to an output terminal of said second emitter coupled logic circuit, and wherein the voltage drop across said level shift element is set to be substantially equal to a voltage across the base and emitter of an emitter follower output transistor of said emitter follower output circuit so that said first and second emitter coupled logic circuits can operate using the same reference potential for comparison with their respective input signals and so that said output signals at said output terminals of said first and second emitter coupled logic circuits have substantially identical voltage levels for high and low level output signals provided at said respective output terminals.

2. A complex logic circuit according to claim 1, wherein said first emitter coupled logic circuit and said second emitter coupled logic circuit are formed in a monolithic semiconductor integrated circuit.

3. A complex logic circuit according to claim 1, whrein said level shift element comprises a diode.

4. A complex logic circuit according to claim 3, wherein said first load circuit comprises a plurality of gate circuits.

5. A complex logic circuit according to claim 3, wherein said first load circuit comprises a plurality of said second emitter coupled logic circuits which each have their signal input terminals coupled to said output terminal of said emitter follower output circuit of said first emitter coupled logic circuit.

6. A complex logic circuit comprising a plurality of emitter coupled logic circuits commonly connected to a reference potential for comparing with input signals respectively received by said emitter coupled logic circuits, said complex logic circuit comprising:

a first emitter coupled logic circuit having first and second load resistors, a first current source, a first current switch transistor having its base electrode connected to a signal input terminal, its emitter electrode connected to said first current source and its collector electrode connected to a point of operation potential through said first load resistor, a second current switch transistor having its base electrode connected to a reference potential point which is supplied with a reference potential, its emitter electrode connected to said first current source and its collector electrode connected to said point of operation potential through said second load resistor, and an emitter follower output circuit having its input connected to an electrode selected from said collector electrodes of said first and second current switch transistors and an output terminal connected to a first load circuit, and a second emitter coupled logic circuit having third and fourth load resistors, a second current source, a third current switch transistor having its base electrode connected to a signal input terminal, its emitter electrode connected to said second current source, and its collector electrode connected to a node through said third load resistor, a fourth current switch transistor having its base electrode connected to a reference potential point which is supplied with the same reference potential as that supplied to the reference potential point of said second current switch transistor, its emitter electrode connected to said second current source and its collector electrode connected to said node through said fourth load resistor and a level shift element which is connected between said point of operation potential and said node, wherein at least one collector electrode of said third and fourth current switch transistors is connected to an output terminal of said second emitter coupled logic circuit, said output terminal of said second emitter coupled logic circuit being coupled to a second load circuit which draws less current from said second emitter coupled logic circuit than said first load circuit draws from said first emitter coupled logic circuit, and wherein the voltage drop across said level shift element is set to be substantially equal to a voltage across the base and emitter of an emitter follower output transistor of said emitter follower output circuit so that said first and second emitter coupled logic circuits can operate using the same reference potential for comparison with their respective input signals and so that said output signals at said output terminals of said first and second emitter coupled logic circuits have substantially identical voltage levels for high and low level output signals provided at said respective output terminals.

7. A complex logic circuit according to claim 6, wherein said level shift element comprises a diode.

* * * * *